(12) United States Patent
Miao et al.

(10) Patent No.: US 10,593,598 B2
(45) Date of Patent: Mar. 17, 2020

(54) VERTICAL FET WITH VARIOUS GATE LENGTHS BY AN OXIDATION PROCESS

(71) Applicant: International Business Machines Corporation, Armonk, NY (US)

(72) Inventors: Xin Miao, Guilderland, NY (US); Kangguo Cheng, Schenectady, NY (US); Chen Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/853,769

(22) Filed: Dec. 23, 2017

(65) Prior Publication Data

US 2019/0198399 A1    Jun. 27, 2019

(51) Int. Cl.

| H01L 21/8234 | (2006.01) |
|---|---|
| H01L 29/78 | (2006.01) |
| H01L 29/66 | (2006.01) |
| H01L 29/423 | (2006.01) |
| H01L 29/51 | (2006.01) |
| H01L 29/49 | (2006.01) |

(Continued)

(52) U.S. Cl.
CPC ....... *H01L 21/823456* (2013.01); *H01L 21/02236* (2013.01); *H01L 21/823418* (2013.01); *H01L 21/823487* (2013.01); *H01L 27/088* (2013.01); *H01L 29/42376* (2013.01); *H01L 29/4966* (2013.01); *H01L 29/517* (2013.01); *H01L 29/6656* (2013.01); *H01L 29/7827* (2013.01)

(58) Field of Classification Search
CPC .......... H01L 27/088; H01L 21/823418; H01L 21/823456; H01L 21/823475; H01L 23/5226; H01L 29/41741; H01L 29/42376; H01L 29/7827; H01L 27/1128; H01L 21/76202–76221; H01L 21/76235; H01L 2027/11833

See application file for complete search history.

(56) References Cited

U.S. PATENT DOCUMENTS

| 8,637,849 B2 | 1/2014 | Deligianni et al. |
| 9,209,033 B2 | 12/2015 | Fernandez et al. |
| 9,236,221 B2 | 1/2016 | Gwinn |

(Continued)

OTHER PUBLICATIONS

Akizuki et al., "SiO2 film formation at room temperature by gas cluster ion beam oxidation," Nuclear Instruments and Methods in Physics Research B 112, pp. 83-85 (May 1996).

*Primary Examiner* — Shahed Ahmed
(74) *Attorney, Agent, or Firm* — Vazken Alexanian; Michael J. Chang, LLC

(57) ABSTRACT

Techniques for forming VFETs with differing gate lengths Lg on the same wafer using a gas cluster ion beam (GCIB) process to produce fins of differing heights are provided. In one aspect, a method of forming fins having different heights includes: patterning the fins having a uniform height in a substrate, the fins including at least one first fin and at least one second fin; forming an oxide at a base of the at least one second fin using a low-temperature directional oxidation process (e.g., GCIB oxidation); and removing the oxide from the base of the at least one second fin to reveal the at least one first fin having a height HI and the at least one second fin having a height H2, wherein H2>H1. VFETs and methods for forming VFETs having different fin heights using this process are also provided.

12 Claims, 14 Drawing Sheets

(51) Int. Cl.
*H01L 27/088* (2006.01)
*H01L 21/02* (2006.01)

(56) References Cited

U.S. PATENT DOCUMENTS

| | | |
|---|---|---|
| 9,530,700 B1 | 12/2016 | Mallela et al. |
| 9,735,042 B2 | 8/2017 | Hung et al. |
| 9,741,626 B1 | 8/2017 | Cheng et al. |
| 9,761,727 B2 | 9/2017 | Mallela et al. |
| 2004/0222477 A1* | 11/2004 | Aller ........................ H01L 21/84 257/412 |
| 2009/0152629 A1* | 6/2009 | Hu .................... H01L 21/28247 257/344 |
| 2009/0321834 A1 | 12/2009 | Rachmady et al. |
| 2014/0001572 A1 | 1/2014 | Bohr et al. |
| 2017/0054027 A1 | 2/2017 | Liu |
| 2017/0178970 A1 | 6/2017 | Anderson et al. |
| 2018/0240715 A1* | 8/2018 | Xie ................. H01L 21/823885 |

\* cited by examiner

US 10,593,598 B2

1

VERTICAL FET WITH VARIOUS GATE LENGTHS BY AN OXIDATION PROCESS

FIELD OF THE INVENTION

The present invention relates to vertical field effect transistors (VFETs), and more particularly, to techniques for forming VFETs with differing gate lengths Lg on the same wafer using a gas cluster ion beam (GCIB) process to produce fins of differing heights.

BACKGROUND OF THE INVENTION

As opposed to planar complementary metal-oxide-semiconductor (CMOS) devices, vertical field effect transistors (VFETs) are oriented with a vertical fin channel disposed on a bottom source/drain and a top source/drain disposed on the fin channel. The gate runs vertically alongside the vertical fin channel. Thus, with VFETs the gate length (Lg) is decoupled from the device footprint, and as such VFETs have been pursued as a potential device option for scaling CMOS to the 5 nanometer (nm) node and beyond.

For many circuit applications there is a need for devices with different gate lengths (Lg). With a VFET architecture, however, creating different gates lengths can be challenging due to the vertical orientation of the fin channel.

Therefore, techniques for efficiently and effectively forming VFET devices with different gate lengths would be desirable.

SUMMARY OF THE INVENTION

The present invention provides techniques for forming VFETs with differing gate lengths Lg on the same wafer using a gas cluster ion beam (GCIB) process to produce fins of differing heights. In one aspect of the invention, a method of forming fins having different heights is provided. The method includes: patterning the fins having a uniform height in a substrate, the fins including at least one first fin and at least one second fin; forming an oxide (e.g., a GCIB oxide) at a base of the at least one second fin using a low-temperature directional oxidation process (e.g., GCIB oxidation); and removing the oxide from the base of the at least one second fin to reveal the at least one first fin having a height H1 and the at least one second fin having a height H2, wherein H2>H1.

In another aspect of the invention, a method of forming a VFET device is provided. The method includes: patterning fins having a uniform height in a substrate, the fins including at least one first fin and at least one second fin; forming bottom source and drains at a base of the fins; selectively recessing the at least one second fin and the bottom source and drains at the base of the at least one second fin using a low-temperature directional oxidation process such that i) the at least one first fin has a height H1 and the at least one second fin has a height H2, wherein H2>H1, and ii) the bottom source and drains at the base of the at least one first fin has a thickness t1 and the bottom source and drains at the base of the at least one second fin has a thickness t2, wherein t1>t2, and wherein H1+t1=H2+t2; forming bottom spacers on the bottom source and drains; forming gates above the bottom spacers alongside the fins, wherein the gates alongside the at least one first fin have a first gate length Lg1, wherein the gates alongside the at least one second fin have a second gate length Lg2, and wherein Lg2>Lg1; forming top spacers above the gates at tops of the fins; and forming top source and drains above the top spacers.

2

In yet another aspect of the invention, another method of forming a VFET device is provided. The method includes: patterning fins having a uniform height in a substrate, the fins including at least one first fin and at least one second fin; selectively recessing the at least one second fin using a low-temperature oxidation process such that the at least one first fin has a height H1' and the at least one second fin has a height H2', wherein H2'>H1'; forming bottom source and drains at a base of the fins; forming bottom spacers on the bottom source and drains; forming gates above the bottom spacers alongside the fins, wherein the gates alongside the at least one first fin have a first gate length Lg1', wherein the gates alongside the at least one second fin have a second gate length Lg2', and wherein Lg2'>Lg1'; forming top spacers above the gates at tops of the fins; and forming top source and drains above the top spacers.

In still yet another aspect of the invention, a VFET device is provided. The VFET device includes: fins patterned in a substrate, the fins including at least one first fin and at least one second fin, wherein the at least one first fin has a height H1' and the at least one second fin has a height H2', wherein H2'>H1'; bottom source and drains disposed at a base of the fins, wherein the bottom source and drains disposed at the base of the at least one first fin has a thickness t1 and the bottom source and drains at the base of the at least one second fin has a thickness t2, wherein t1=t2, and wherein H1'+t1<H2'+t2; bottom spacers disposed on the bottom source and drains; gates above the bottom spacers alongside the fins, wherein the gates alongside the at least one first fin have a first gate length Lg1', wherein the gates alongside the at least one second fin have a second gate length Lg2', and wherein Lg2'>Lg1'; top spacers disposed above the gates at tops of the fins; and top source and drains above the top spacers.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for forming vertical field effect transistors (VFETs) with various gate lengths (Lg) using room-temperature gas cluster ion beam (GCIB) to precisely oxidize/recess the fin bottom to get different fin height (and thus different Lg). As will be described in detail below, unlike conventional thermal oxidation processes, room-temperature GCIB advantageously does not produce any undesired dopant diffusion in the pre-doped fin top for the top source and drain junction.

As will become apparent from the description that follows, each VFET device includes a vertical fin channel over a bottom source and drain. A gate is present alongside the vertical fin channel. A top source and drain is disposed above the gate at the top of the vertical fin channel. Bottom and top spacers separate the gate from the bottom and top source and drains, respectively. Two exemplary embodiments will be described below. In a first exemplary embodiment, the GCIB process is performed after formation of the bottom source and drains. In a second exemplary embodiment, the GCIB process is performed before formation of the bottom source and drains. In both cases, the GCIB oxide formed is a sacrificial material (i.e., it is removed).

Figure 1:
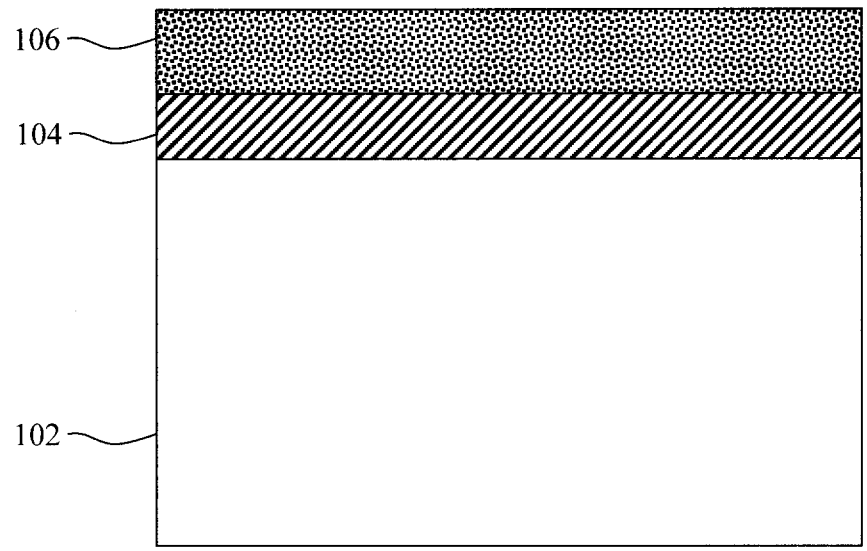
FIG. 1 is a diagram illustrating a starting structure for forming a vertical field effect transistor (VFET) device including a doped layer having been formed on a substrate, and a hardmask layer having been formed on the doped layer according to an embodiment of the present invention.

An exemplary embodiment will now be described by way of reference to FIGS. 1-18. As shown in FIG. 1, the process begins with substrate 102. According to an exemplary embodiment, the substrate 102 is undoped.

A variety of different substrate 102 configurations can be implemented in accordance with the present techniques. For instance, according to one exemplary embodiment, the starting substrate 102 is a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

A doped layer 104 is formed on the substrate 102. As will become apparent from the description that follows, doped layer 104 will serve as an extension between the vertical fins channels and the top source and drains. According to one exemplary embodiment, the doped layer 104 is formed from an in-situ doped (i.e., during growth) or ex-situ doped (i.e., via a process such as ion implantation) epitaxial material. Suitable epitaxial materials include, but are not limited to, epitaxial Si, Ge and/or SiGe. Suitable n-type dopants include phosphorous (P) and/or arsenic (As), and suitable p-type dopants include, but are not limited to, boron (B).

According to another exemplary embodiment, doped layer 104 is formed using ion implantation of a dopant(s) into the substrate 102. As provided above, suitable n-type dopants include phosphorous (P) and/or arsenic (As), and suitable p-type dopants include, but are not limited to, boron (B).

A hardmask layer 106 is next deposited onto the doped layer 104. Suitable hardmask materials 106 include, but are not limited to, silicon nitride (SiN) and/or silicon oxynitride (SiON). While shown as a single layer, hardmask layer 106 may in fact include a stack of layers as would be apparent to one skilled in the art. For instance, by way of example only, a hardmask stack might include a nitride layer (e.g., SiN) in between two oxide layers (e.g., SiON). Alternatively, a single layer hardmask layer 106 may be implemented.

The hardmask 106 is then used to pattern fins in the doped layer 104 and substrate 102. To do so, the hardmask 106 first needs to be patterned into individual fin hardmasks marking the footprint and location of the fins. Direct patterning can be used to pattern the hardmask. Alternatively, in the example shown, a sidewall image transfer (SIT) process is used. An advantage to SIT is that it permits the patterning of feature sizes below that which can be achieved using direct patterning. Thus, with SIT fins can be patterned at a sub-lithographic pitch.

Figure 2:
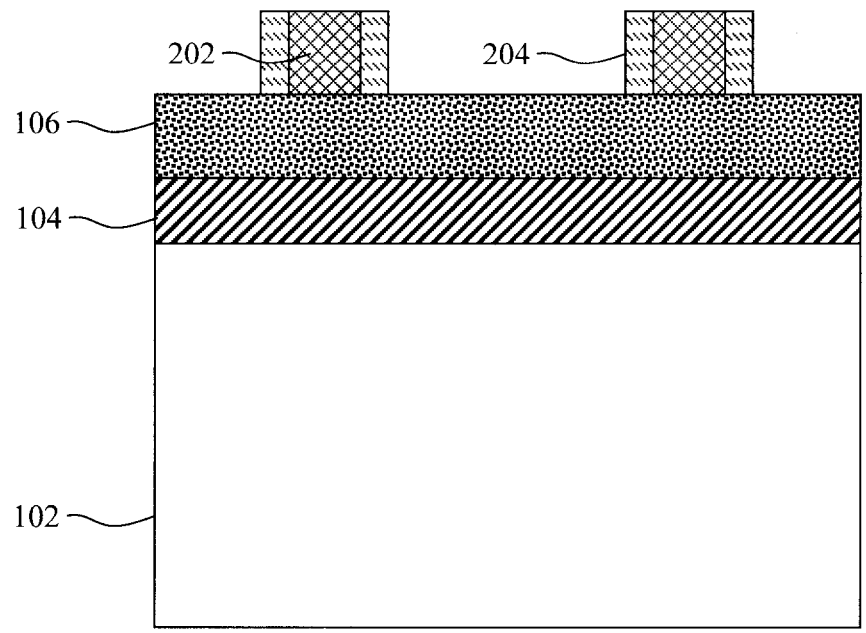
FIG. 2 is a diagram illustrating mandrels having been patterned on the hardmask layer, and sidewall spacers having been formed on opposite sides of the mandrels according to an embodiment of the present invention.

As shown in FIG. 2, SIT involves first patterning mandrels 202 on the hardmask layer 106. The mandrels 202 are a sacrificial structure used solely to place sidewall spacers. Thus, the mandrels 202 are formed from a material that can be selectively removed relative to the spacers such as amorphous silicon, poly-silicon, amorphous carbon, silicon germanium (SiGe), an organic planarization layer (OPL), silicon dioxide (SiO$_2$) and/or SiN.

Following patterning of the mandrels 202, sidewall spacers 204 are formed on opposite sides of the mandrels 202. See FIG. 2. By way of example only, a suitable spacer material is blanket deposited onto and covering the mandrels 202. The spacer material is then patterned into the individual spacers 204 using, e.g., a directional etching process such as reactive ion etching (RIE). Suitable materials for spacers 204 include, but are not limited to, SiO$_2$, SiN, silicon oxynitride (SiON), silicon carbide (SiC) and/or amorphous carbon. However, as provided above, the mandrels 202 will be removed selective to the spacers 204. Thus, the choice of mandrel and spacer material should be made to permit this etch selectivity. For instance, when the mandrels 202 are formed from an oxide material such as SiO$_2$, the spacers 204 can be formed from a nitride material (such as SiN), or vice versa.

Figure 3:
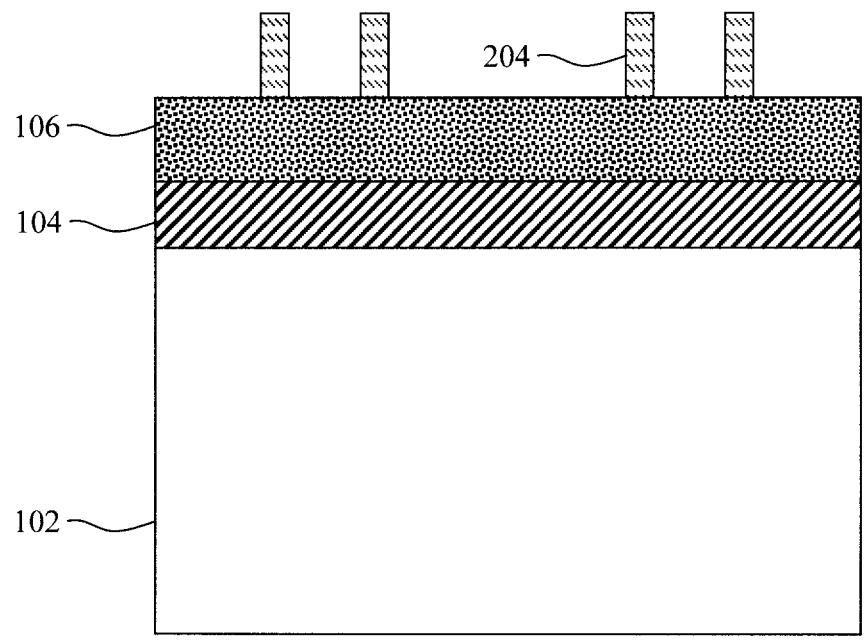
FIG. 3 is a diagram illustrating the mandrels have been selectively removed leaving behind the sidewall spacers according to an embodiment of the present invention.
Figure 4:
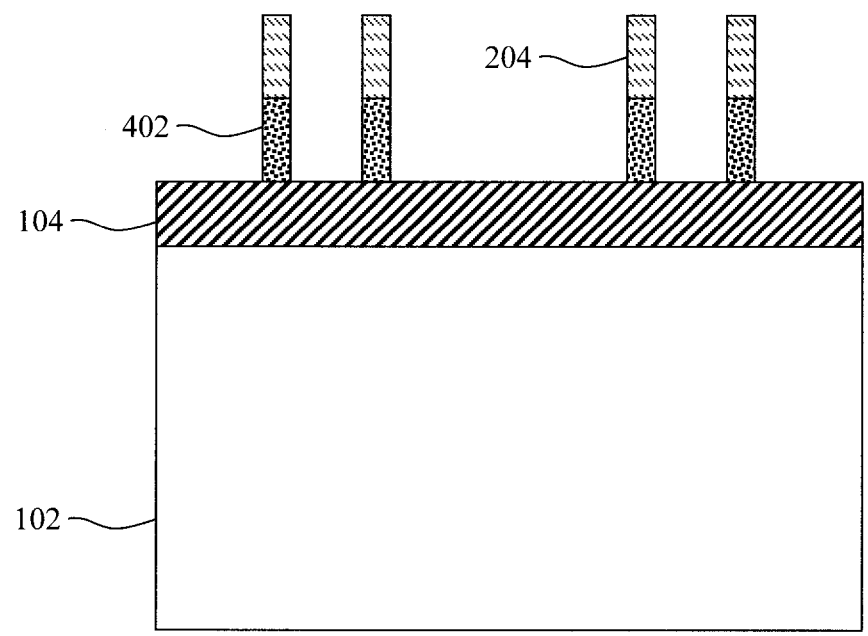
FIG. 4 is a diagram illustrating the sidewall spacers having been used to pattern the hardmask layer into individual fin hardmasks according to an embodiment of the present invention.

As shown in FIG. 3, the mandrels 202 have been selectively removed leaving behind the spacers 204. It is notable that the SIT process described herein is a pitch doubling technique. Namely, there are now two spacers 204 for every mandrel 202 originally patterned on the hardmask layer 106.

The spacers 204 are then used to pattern the hardmask layer 106 into individual fin hardmasks 402. See FIG. 4. A directional etching process such as RIE can be used to pattern the hardmask layer 106, after which any remaining spacers 204 can be removed.

Figure 5:
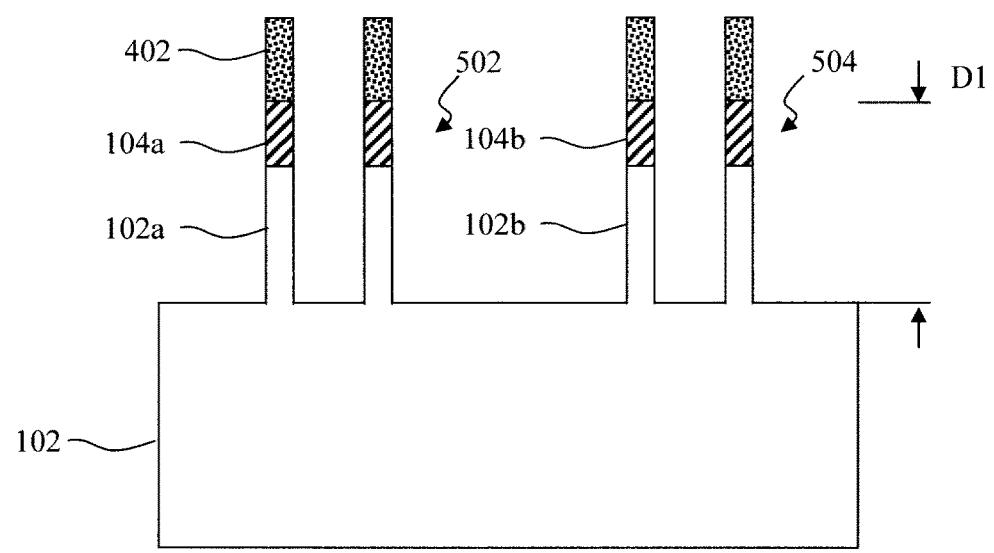
FIG. 5 is a diagram illustrating the fin hardmasks having been used to pattern (first/second) fins in the doped layer and substrate according to an embodiment of the present invention.

The fin hardmasks 402 are then used to pattern fins in the doped layer 104 and substrate 102. See FIG. 5. An etching process such as RIE can be used to pattern the fins. According to an exemplary embodiment, the fins include at least one first fin 502 and at least one second fin 504. In this particular example, the fins 502 will be used as the basis for forming VFETs having a first gate length (Lg1) and the fins 504 will be used as the basis for forming VFETs having a second gate length (Lg2), wherein Lg2>Lg1. Thus, advantageously, the present techniques can be used to form VFETs of differing gate length on the same wafer. As shown in FIG. 5, the fins 502/504 at present have a uniform height.

As shown in FIG. 5, each of the fins 502 and 504 includes a patterned portion 102a,b of the substrate 102, and a patterned portion 104a,b of the doped layer 104, respectively. The patterned portion 102a,b of fins 502/504 will serve as vertical fin channels, while the patterned portion 104a,b of fins 502/504 will serve as an extension between the vertical fins channels and the top source and drains. Further, as shown in FIG. 5, the fins 502/504 as patterned extend only partway through the substrate 102. It is notable that the fin etch performed as shown in FIG. 5 is a partial fin etch (e.g., to a first depth D1). Namely, the fins are partially etched in the substrate 102 to enable sacrificial spacers to be placed along the sidewalls of the fins 502/504. Following placement of the sacrificial spacers, the fin etch is extended to expose the base of the fins 502/504 for bottom source and drain formation.

Figure 6:
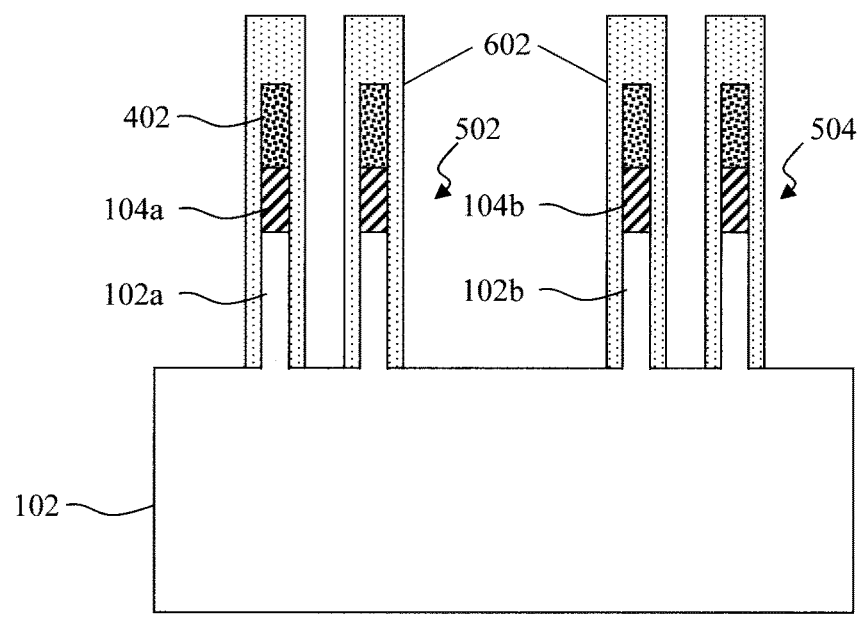
FIG. 6 is a diagram illustrating sacrificial spacers having been formed alongside the fins according to an embodiment of the present invention.

Specifically, as shown in FIG. 6 sacrificial spacers 602 are next formed on the fins 502/504, alongside the patterned portions 102a,b (i.e., the vertical fin channels) and 104a,b. Suitable sacrificial spacer materials include, but are not limited to, SiO$_2$, SiN and/or SiON.

Figure 7:
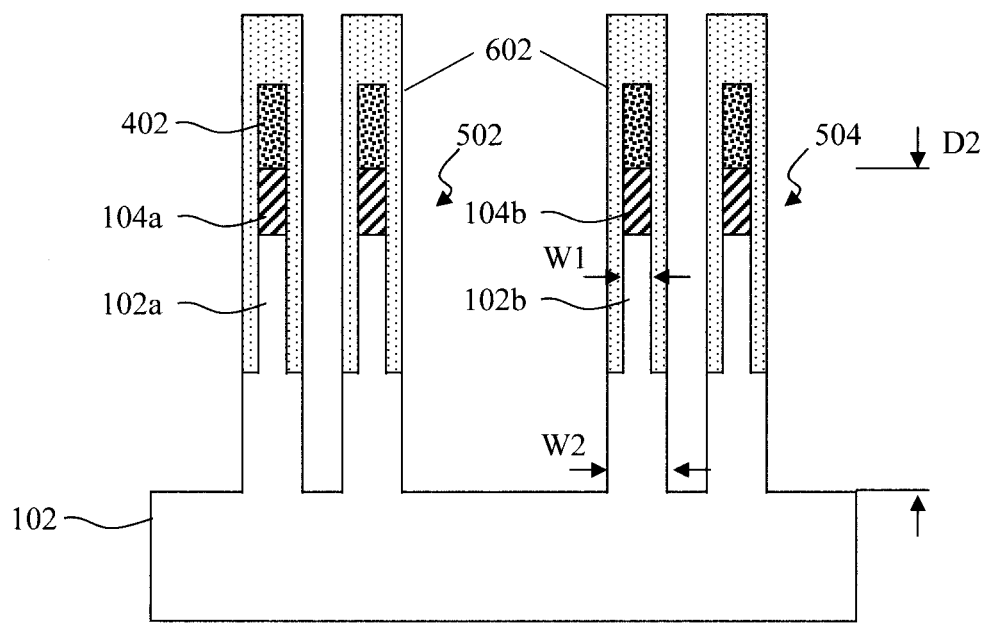
FIG. 7 is a diagram illustrating the fins having been extended into the substrate according to an embodiment of the present invention.

Next, as shown in FIG. 7, the fins 502 and 504 are extended into the substrate 102 to a depth D2, wherein D2>D1 (compare, e.g., with the partial fin etch shown in FIG. 5). Further, as a result of this two step fin etch and placement of the sacrificial spacers 602, the tops of the fins 502 and 504 each have a first width W1, and the base/bottoms of the fins 502/504 each have a second width W2, wherein W2>W1. See FIG. 7

Figure 8:
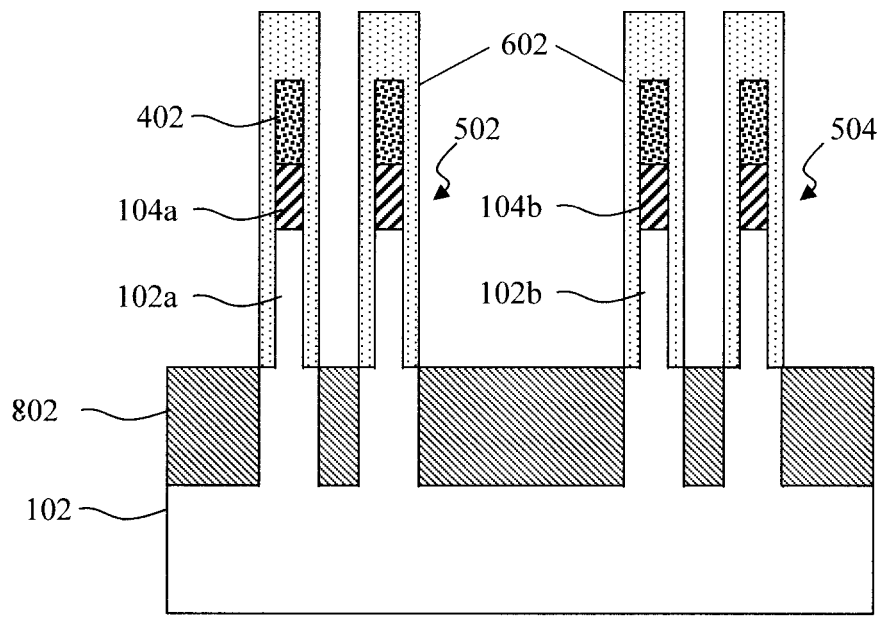
FIG. 8 is a diagram illustrating bottom source and drain having been formed at the base of the fins and the sacrificial spacers having been removed according to an embodiment of the present invention.

As highlighted above, the extended fin etch exposes the base of the fins 502/504 (below the sacrificial spacers 602) for bottom source and drain formation. For example, as shown in FIG. 8 bottom source and drain 802 are next formed at the base of the fins 502/504. According to an exemplary embodiment, the bottom source and drains 802 are formed from an in-situ doped (i.e., during growth) or ex-situ doped (i.e., via a process such as ion implantation) epitaxial material (e.g., epitaxial Si, Ge and/or SiGe). As provided above, suitable n-type dopants include phosphorous (P) and/or arsenic (As), and suitable p-type dopants include, but are not limited to, boron (B).

Other techniques are also contemplated herein for forming the bottom source and drains 802. For instance, the bottom source and drains 802 can instead be formed using ion implantation of a dopant(s) into the substrate 102 beneath the fins 502 and 504. As provided above, suitable n-type dopants include phosphorous (P) and/or arsenic (As), and suitable p-type dopants include, but are not limited to, boron (B).

Figure 9:
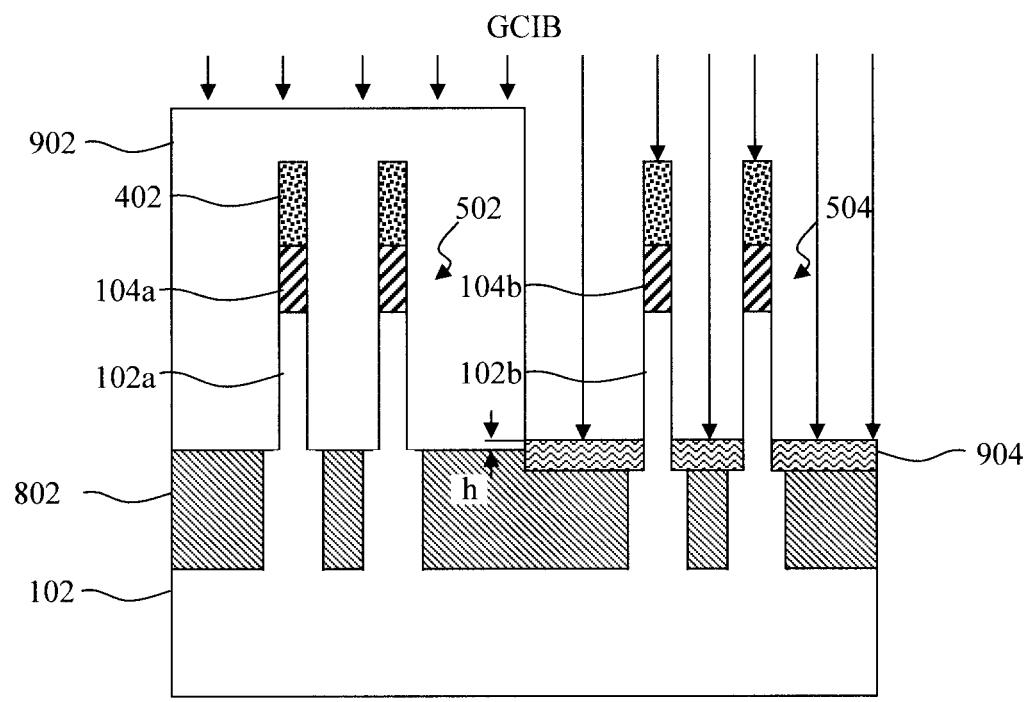
FIG. 9 is a diagram illustrating a block mask having been formed over the (first) fins, and a low temperature GCIB oxidation process having been used to form a GCIB oxide at the bottom source and drains at the base of (second) fins according to an embodiment of the present invention.

Following formation of the bottom source and drains 802, the sacrificial spacers 602 are removed. A block mask 902 is then formed over the fins 502. See FIG. 9. As shown in FIG. 9, placement of the block mask 902 selectively exposes the fins 504 and the bottom source and drains 802 at the base of fins 504 to a low temperature oxidation process to recess the base of fins 504, thereby increasing the height of fins 504. See FIG. 9.

According to an exemplary embodiment, the oxidation is carried out using a gas cluster ion beam (GCIB) process. GCIB uses electrically charged cluster ions of gaseous materials to bombard a surface producing sputtering and implantation effects. See, for example, Yamada et al., "Cluster ion beam process technology," Nuclear Instruments and Methods in Physics Research B 206, pgs. 820-829 (May 2003), the contents of which are incorporated by reference as if fully set forth herein. Advantageously, GCIB can be used as an effective oxidation process at room temperature. For instance, oxygen ($O_2$) and carbon dioxide ($CO_2$) cluster ions can be used to form an oxide on semiconductor surfaces at room temperature. See, for example, Akizuki et al., "$SiO_2$ film formation at room temperature by gas cluster ion beam oxidation," Nuclear Instruments and Methods in Physics Research B 112, pgs. 83-85 (1996), the contents of which are incorporated by reference as if fully set forth herein. By way of example only, the term "room temperature," as used herein, refers to a temperature of from about 20° C. to about 30° C., and ranges therebetween.

Use of a room temperature oxidation process is advantageous because it does not cause undesired dopant diffusion from the patterned portion 104a,b of the doped layer 104 and the bottom source and drains 802 into the vertical fin channels (i.e., patterned portions 102a,b of the substrate 102) of fins 502/504, respectively. By contrast, conventional thermal oxidation processes involve elevated temperatures (e.g., temperatures as high as 900° C.) which would cause dopants to undesirably diffuse into the vertical fin channels from the patterned portion 104a,b of the doped layer 104 and the bottom source and drains 802.

A GCIB oxidation process (a directional oxidation process which preferably oxidizes exposed horizontal surfaces) is also effective at recessing the fins 504. Namely, as shown in FIG. 9, a GCIB oxide 904 is formed on the exposed horizontal surfaces of fins 504 and the bottom source and drains 802 at the base of fins 504. Formation of this GCIB oxide 904 consumes a portion of the fins 504 and the bottom source and drains 802 at the base of fins 504. As a result, when the GCIB oxide 904 is later removed (see below), the fins 504 and the bottom source and drains 802 at the base of fins 504 will be recessed (e.g., from about 2 nanometers (nm) to about 15 nm, and ranges therebetween). Following the GCIB oxidation, the block mask 902 is removed.

It is notable that there is volume expansion during the GCIB oxidation process. Thus, as shown in FIG. 9, the top of the GCIB oxide 904 formed is actually at height h taller than the top surface of the bottom source and drains 802. This volume expansion can be as high as 2:1. Thus, for example, a GCIB oxide 904 formed to a thickness of about 6 nm consumes about 3 nm of the bottom source and drains 802, i.e., h=3 nm.

Removal of the GCIB oxide 904 (e.g., using an oxide-selective etch) reveals that the fins 504 and the bottom source and drains 802 at the base of fins 504 have been recessed (i.e., relative to the fins 502 and the bottom source and drains 802 at the base of fins 502). See FIG. 10. As a result, the height of fins 504 is increased (relative to fins 502).

Figure 10:
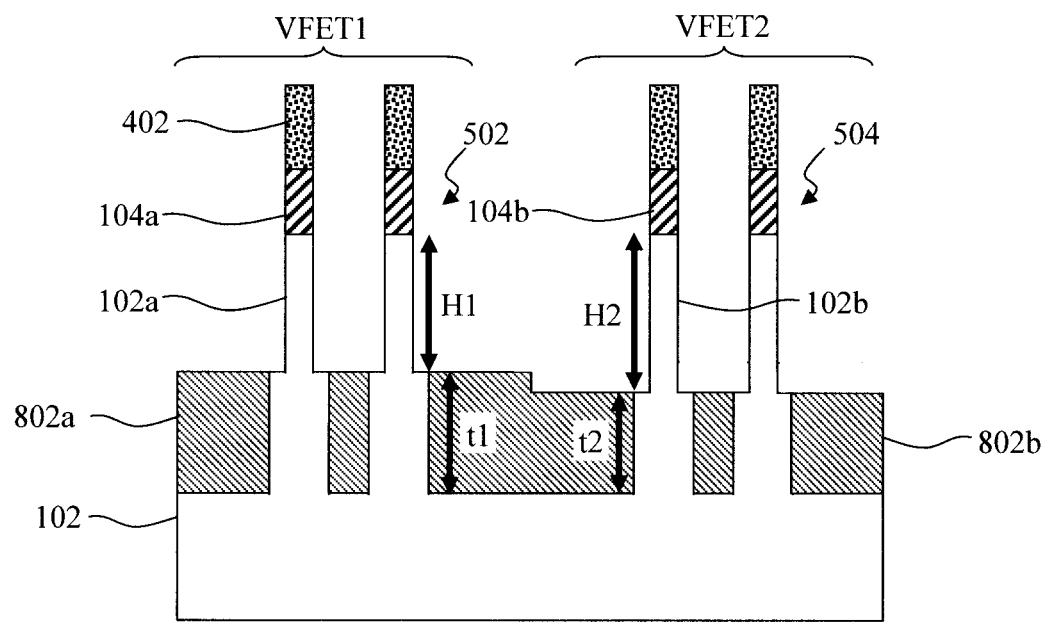
FIG. 10 is a diagram illustrating the GCIB oxide having been removed revealing that the (second) fins and the bottom source and drains at the base of (second) fins have been recessed thereby increasing the height of the (second) fins, the (first) fins corresponding to at least one VFET1 and the (second) fins corresponding to at least one VFET2 according to an embodiment of the present invention.

For instance, as shown in FIG. 10, the (as-patterned) fins 502 have a height L1, whereas the (recessed) fins 504 have a height H2, wherein H2>H1. Similarly, the (as-formed) bottom source and drains 802 at the base of the fins 502 have a thickness t1, whereas the (recessed) bottom source and drains 802 at the base of fins 504 have a thickness t2, wherein t1>t2. Notably, due to the concurrent patterning of the fins 502 and 504 (followed by the selective recess of fins 504), H1+t1=H2+t2. For clarity, the bottom source and drains 802 at the base of the fins 502 and 504 will now be given reference numerals 802a and 802b, respectively.

As highlighted above, the fins 502 will be used as the basis for forming VFETs having a first gate length (Lg1) and the fins 504 will be used as the basis for forming VFETs having a second gate length (Lg2), wherein Lg2>Lg1. For clarity, these devices are labeled in the figures that follow as VFET1 and VFET2, respectively.

Figure 11:
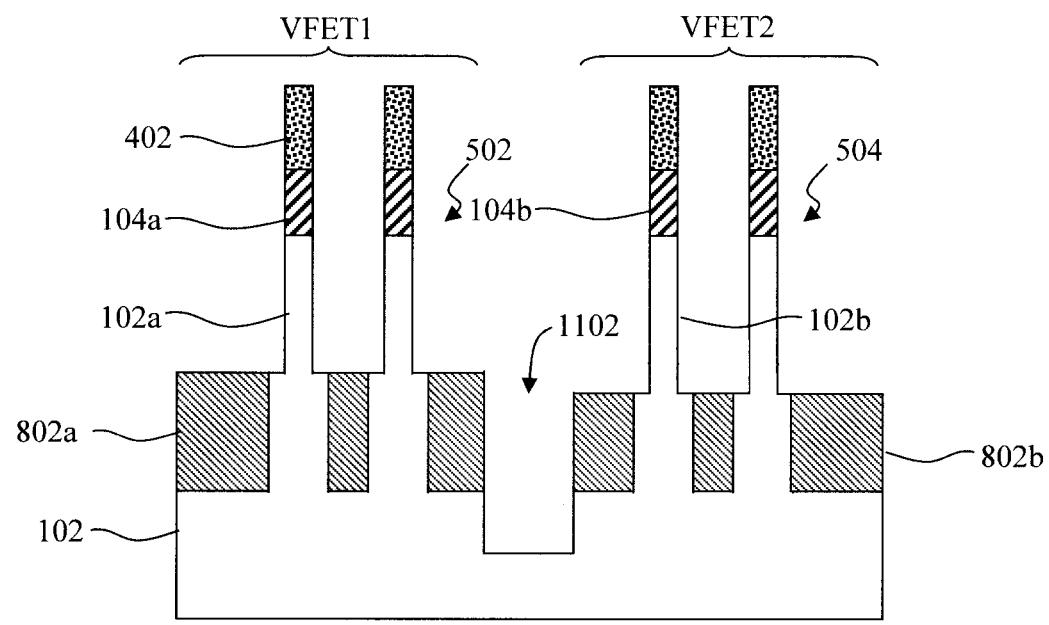
FIG. 11 is a diagram illustrating a trench having been patterned in the substrate separating the (first) fins from the (second) fins according to an embodiment of the present invention.
Figure 12:
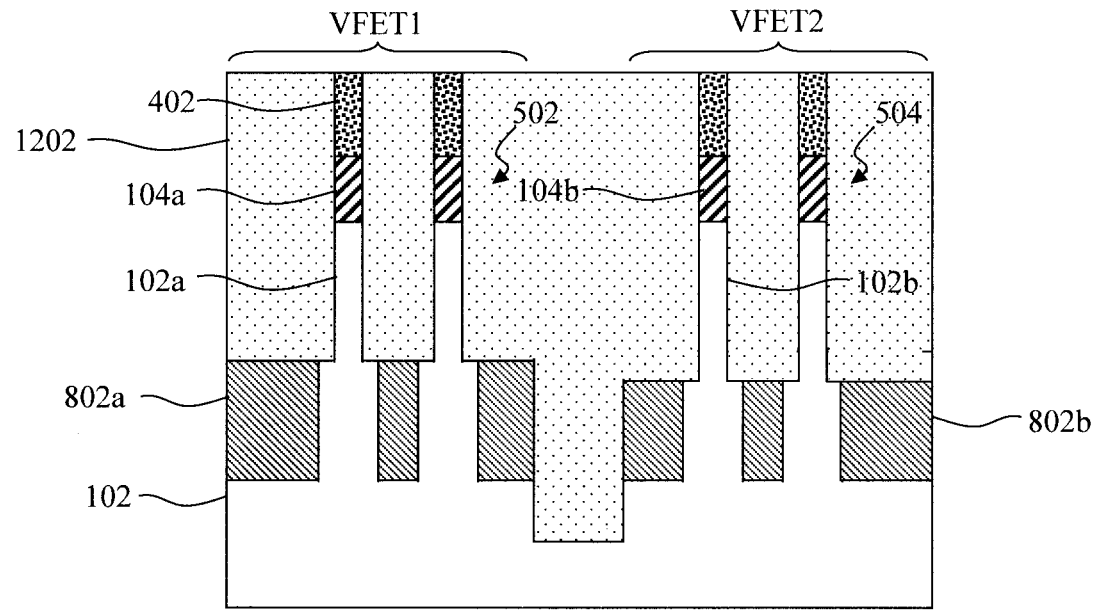
FIG. 12 is a diagram illustrating the fins having been buried in an insulator that fills the trench according to an embodiment of the present invention.

Isolation between the VFET1 fins 502 and the VFET2 fins 504 is created using a shallow trench isolation process. Namely, as shown in FIG. 11 a trench 1102 is first patterned in the substrate 102 separating the fins 502 from the fins 504. The fins 502 and 504 are then buried in an insulator 1202 that fills the trench 1102. See FIG. 12. Suitable insulators 1202 include, but are not limited to oxide materials such as $SiO_2$. When the insulator 1202 is an oxide, it may also be referred to herein as an STI oxide. As shown in FIG. 12, the as-deposited insulator 1202 is polished down to the fin hardmasks 402 using a process such as chemical-mechanical polishing (CMP).

Figure 13:
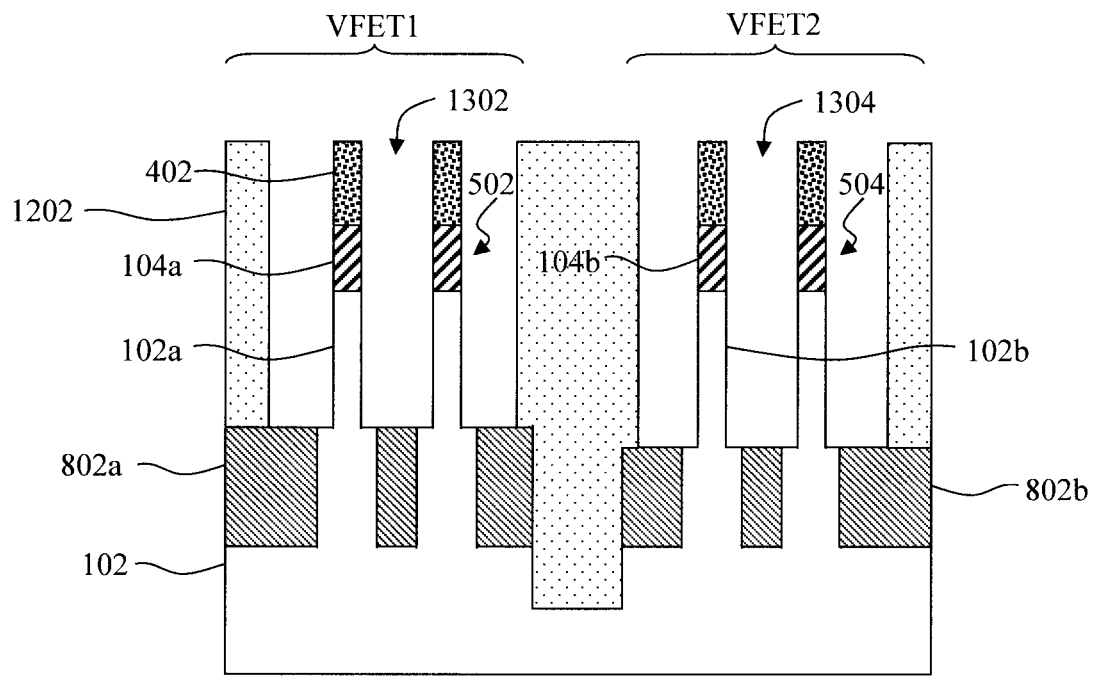
FIG. 13 is a diagram illustrating the insulator having been opened up in gate regions of the VFET1 and VFET2 devices according to an embodiment of the present invention.
Figure 14:
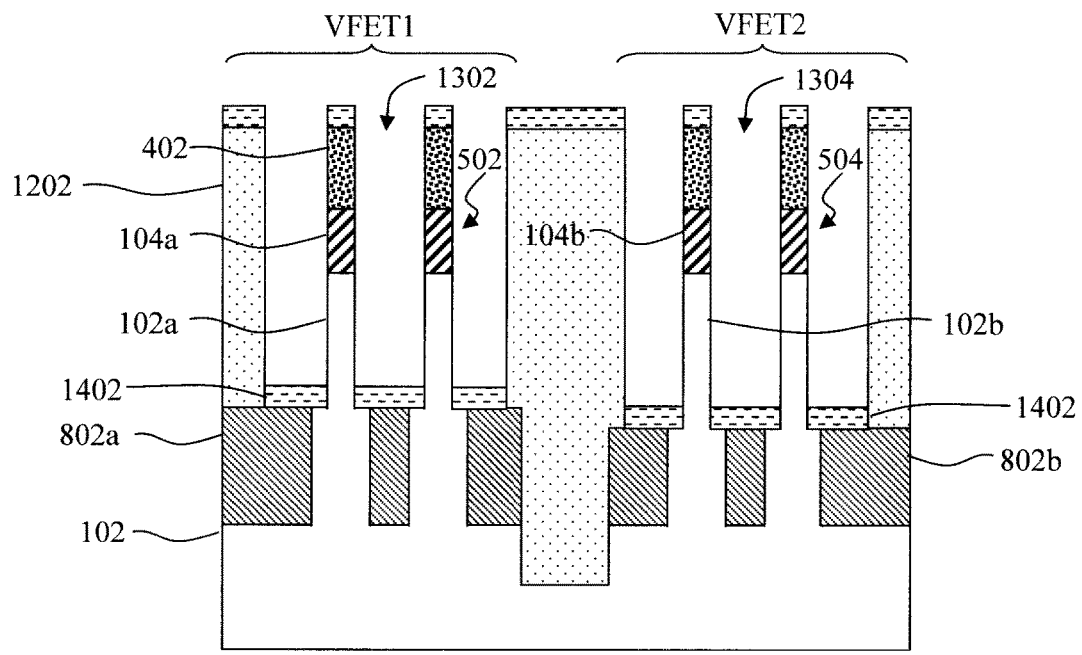
FIG. 14 is a diagram illustrating bottom spacers having been formed on the bottom source and drains at the base of the (first) fins and the (second) fins according to an embodiment of the present invention.
Figure 15:
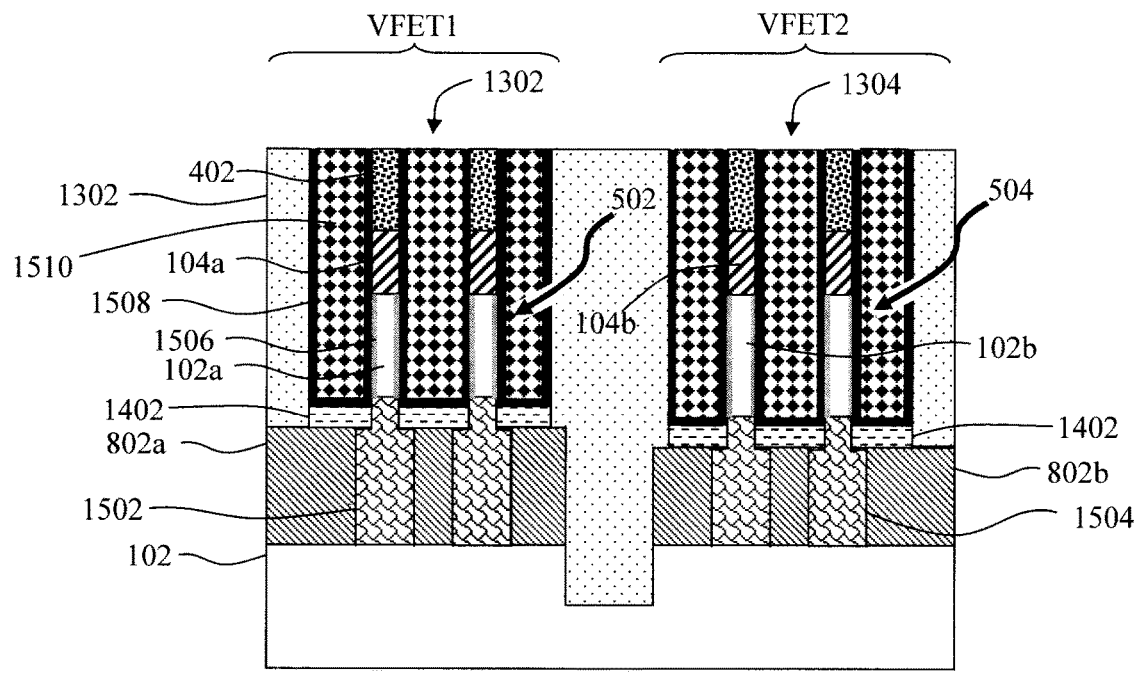
FIG. 15 is a diagram illustrating extensions having been formed between the bottom source and drains and the vertical fin channels, and gates having been formed alongside the fins according to an embodiment of the present invention.

Standard lithography and etching techniques are next used to open up the insulator 1202 in gate regions of the VFET1 and VFET2 devices. See FIG. 13. As shown in FIG. 13, opening up the gate regions of the VFET1 and VFET2 devices involves removing the insulator 1202 from along the sidewalls of the fins 502 and 504 which forms trenches 1302 and 1304, respectively, in the insulator 1202. As shown in FIG. 13, fins 502 and 504 are present in trenches 1302 and 1304 in the insulator 1202.

Bottom spacers 1402 are then formed on the bottom source and drains 802a,b at the base of the fins 502 and 504, respectively. See FIG. 14. Suitable materials for the bottom spacers 1402 include, but are not limited to, oxide spacer materials such as silicon dioxide ($SiO_2$) and/or silicon oxycarbide (SiOC) and/or nitride spacer materials such as SiN and/or silicon-boron-nitride (SiBN).

According to an exemplary embodiment, the bottom spacers 1402 are formed using a directional deposition process whereby the spacer material is deposited onto the bottom source and drains 802a,b, fin hardmasks 402 and insulator 1202 with a greater amount of the material being deposited on these horizontal surfaces as compared to exposed vertical surfaces (such as along sidewalls of the fins 502 and 504). Thus, when an etch is used on the spacer material, the timing of the etch needed to remove the spacer material from the vertical surfaces will leave the bottom spacers 1402 shown in FIG. 14 on the bottom source and drains 802a,b (as well as on the fin hardmasks 402 and insulator 1202) since a greater amount of the spacer material was deposited on these horizontal surfaces to begin with. By way of example only, a high density plasma (HDP) chemical vapor deposition (CVD) or physical vapor deposition (PVD) process can be used for directional film deposition, and an oxide- or nitride-selective (depending on the spacer material) isotropic etch can be used to remove the (thinner) spacer material deposited onto the vertical surfaces.

The next stage in the process is to form gates along the sidewalls of the fins 502 and 504 above the bottom source and drains 802a,b. The thermal anneal during the gate processing (and optionally a thermal anneal prior to the gate processing) serves to drive dopants from the bottom source and drains 802a,b into the base of the fins 502 and 504, respectively to form extensions 1502 and 1504 between the bottom source and drains 802a,b and the vertical fin channels (i.e., patterned portions 102a,b of the substrate 102), and from the patterned portion 104a,b of the doped layer 104 into the vertical fin channels (i.e., patterned portions 102a,b of the substrate 102), respectively. See FIG. 15.

Gates (i.e., a gate dielectric and a gate conductor) are formed alongside the fins 502 and 504 above the bottom source and drains 802a,b. To form the gates, an interfacial oxide 1506 (e.g., $SiO_2$ which may include other chemical elements in it such as nitrogen, germanium, etc.) is first formed selectively on exposed surfaces of the fins 502 and 504 by an oxidation process to a thickness of from about 0.3 nanometers (nm) to about 5 nm, and ranges therebetween, e.g., about 1 nm. A conformal gate dielectric 1508 is then deposited (into trenches 1302 and 1304) onto the fins 502/504, respectively, over the interfacial oxide 1506 and onto insulator 1202 and the bottom spacers 1402. A gate conductor 1510 is then deposited onto the conformal gate dielectric 1508. See FIG. 15.

According to an exemplary embodiment, a metal gate is formed wherein the gate conductor 1510 is a metal or combination of metals and the gate dielectric 1508 is a high-κ dielectric. For instance, the gate conductor 1510 is a workfunction setting metal. The particular workfunction metal employed can vary depending on whether an n-type or p-type transistor is desired. Suitable n-type workfunction setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction setting metals include, but are not limited to, TiN, TaN, and tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above.

The term "high-κ" as used herein refers to a material having a relative dielectric constant κ which is much higher than that of silicon dioxide (e.g., a dielectric constant κ=25 for hafnium oxide ($HfO_2$) rather than 3.9 for silicon dioxide). Suitable high-κ gate dielectrics include, but are not limited to, $HfO_2$ and/or lanthanum oxide ($La_2O_3$).

Figure 16:
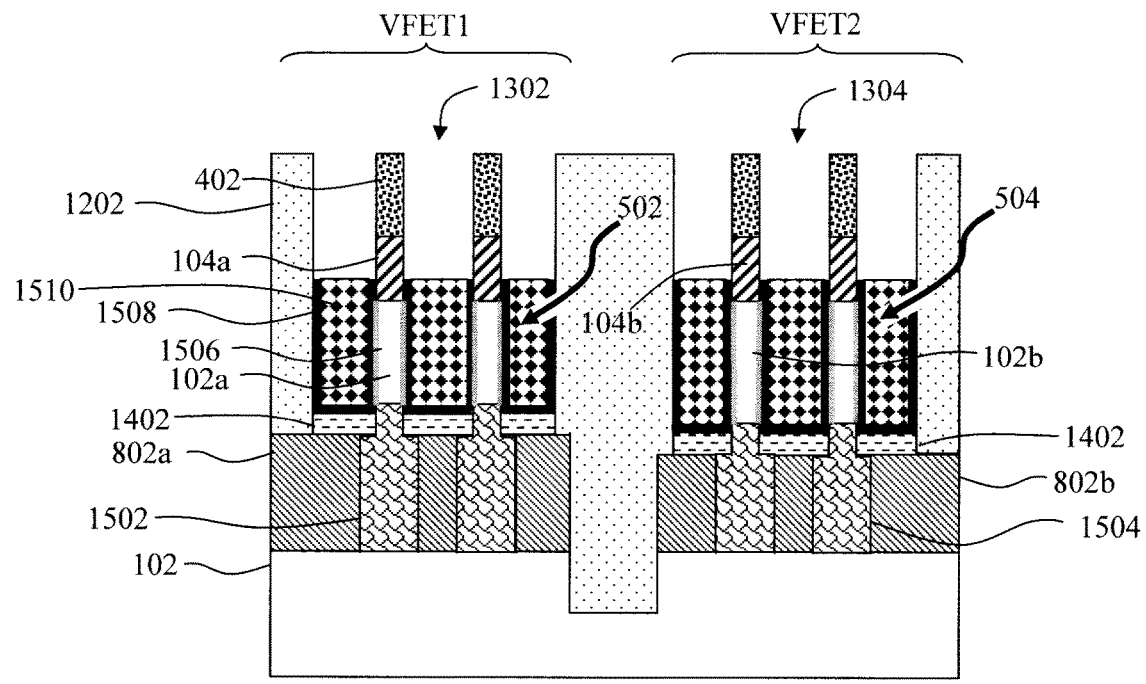
FIG. 16 is a diagram illustrating the gates having been recessed according to an embodiment of the present invention.

The gates (i.e., interfacial oxide 1506, gate dielectric 1508 and gate conductor 1510) are then recessed to expose the tops of the fins 502 and 504 for top source and drain formation. See FIG. 16. Notably, as shown in FIG. 16, the gates are recessed to the same (level) in both the VFET1 and VFET2 regions. However, due to a deeper recess of the fins 504 in the VFET2 region of the wafer 102 (to a height H2) as compared to the height (H1) of the fins 502 in the VFET1 region of the wafer 102, the gate length of the VFET2 (Lg2) will be greater than the gate length of the VFET1 (Lg1), i.e., Lg2>Lg1.

Top spacers 1702 are then formed above the gates at the tops of the fins 502 and 504. See FIG. 17. Suitable materials for the top spacers 1702 include, but are not limited to, oxide spacer materials such as $SiO_2$ and/or silicon oxycarbide (SiOC) and/or nitride spacer materials such as SiN and/or silicon-boron-nitride (SiBN). Like the bottom spacers 1702, the top spacers 1702 can be formed using a directional deposition process whereby the spacer material is deposited with a greater amount of the material being deposited on horizontal surfaces, as compared to vertical surfaces. Thus, when an etch is used on the spacer material, the timing of the etch needed to remove the spacer material from the vertical surfaces will leave the top spacers 1702 shown in FIG. 17 on top of the gates since a greater amount of the spacer material was deposited on these (horizontal) surfaces to begin with.

Top source and drains 1704 and 1706 are then formed over the top spacers 1702 at the tops of the fins 502 and 504, respectively. According to an exemplary embodiment, the top source and drains 1704 and 1706 are formed from an in-situ doped (i.e., during growth) or ex-situ doped (i.e., via a process such as ion implantation) epitaxial material. Suitable epitaxial materials include, but are not limited to, epitaxial Si, Ge and/or SiGe. Suitable n-type dopants include phosphorous (P) and/or arsenic (As), and suitable p-type dopants include, but are not limited to, boron (B). As provided above, patterned portions 104a,b serve as extensions between the top source and drains 1704/1706 and the vertical fin channels (i.e., patterned portions 102a,b of the substrate 102, respectively).

Figure 17:
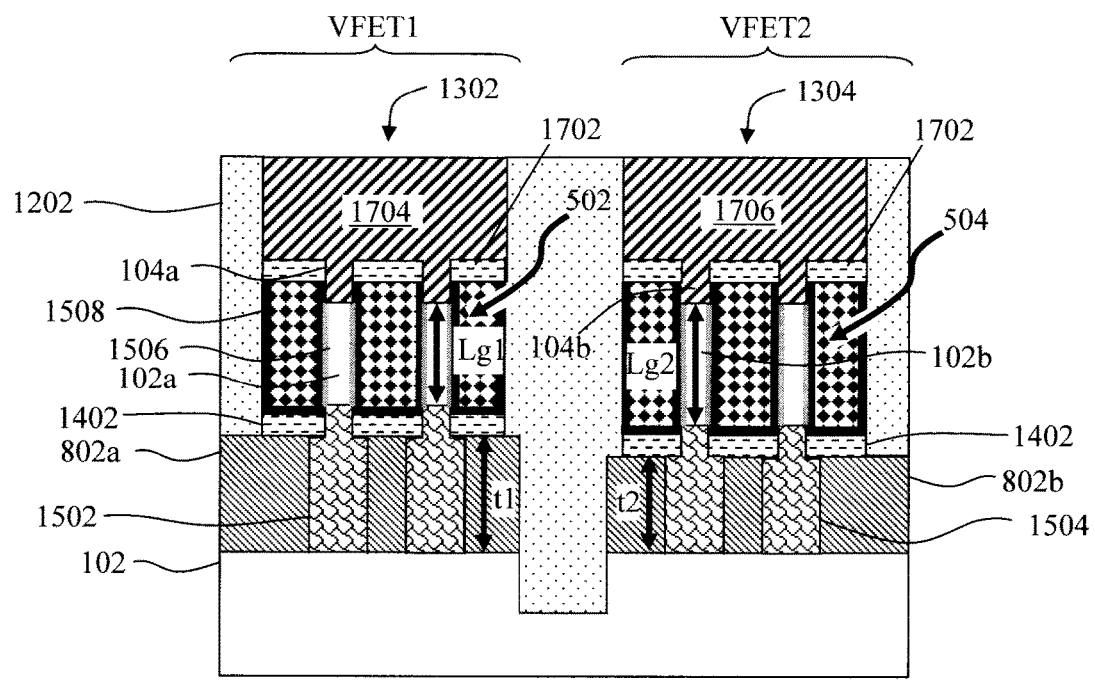
FIG. 17 is a diagram illustrating top spacers having been formed above the gates at the tops of the fins, and top source and drains having been formed over the top spacers according to an embodiment of the present invention.

Based on the above-described low-temperature (GCIB-based) oxidation process, as shown in FIG. 17, the VFET1 devices have a gate length Lg1 and the VFET2 devices have a gate length Lg2, wherein Lg2>Lg1. The gate length is the length of the vertical fin channels (i.e., the patterned portions 102a,b of the substrate 102) in between the top source and drain extensions (i.e., patterned portions 104a,b of the doped layer 104) and the bottom source and drain extensions (i.e., extensions 1702 and 1704).

Further, as highlighted above, the recessed bottom source and drains 802b in the VFET2 devices have a thickness t2, while the bottom source and drains 802a in the VFET1 devices have a thickness t1, wherein t1>t2. However, it is notable that Lg1+t1=Lg2+t2, which means that the gates can be recessed to the same height in both (VFET1 and VFET2) devices, yet different gate lengths are achieved. This aspect is important because it enables the fabrication of the gates in both (VFET1 and VFET2) devices concurrently, just over fins 502 and 504 of differing heights (i.e., H1 and H2, respectively) to create different gate lengths (i.e., Lg1 and Lg2, respectively).

In the process flow just described, the low-temperature oxidation process (to selectively recess the fins) was performed after the bottom source and drains were formed. Alternative process flows are also contemplated herein where a GCIB oxidation is performed prior to forming the bottom source and drains. This alternative exemplary embodiment is now described by way of reference to FIGS. 18-26.

The process begins in the same general manner as that described above. Namely, fins hardmasks 402 are formed on doped layer 104 (using, for example, direct patterning or an SIT process—see FIGS. 1-4), and the fin hardmasks 402 are used to pattern fins 502 and 504 in the doped layer 104 and substrate 102 (e.g., to a depth D1'), each fin 502/504 having a patterned portion 102a,b of the substrate 102 (i.e., the vertical fin channels) and a patterned portion 104a,b of the doped layer 104 (i.e., the top source and drain extensions) (see FIG. 5). Thus, the alternative process beginning in FIG. 18 follows from the structure shown in FIG. 5 and, for consistency, like structures are numbered alike throughout the figures. As such, the starting point of this process involves the fins 502/504 patterned having a uniform height (see description of FIG. 5 above).

In the same manner as above, the fins 502 will be used as the basis for forming VFETs having a first gate length (Lg1) and the fins 504 will be used as the basis for forming VFETs having a second gate length (Lg2), wherein Lg2>Lg1. Thus, this alternative process too is directed to forming VFETs of differing gate length on the same wafer.

Figure 18:
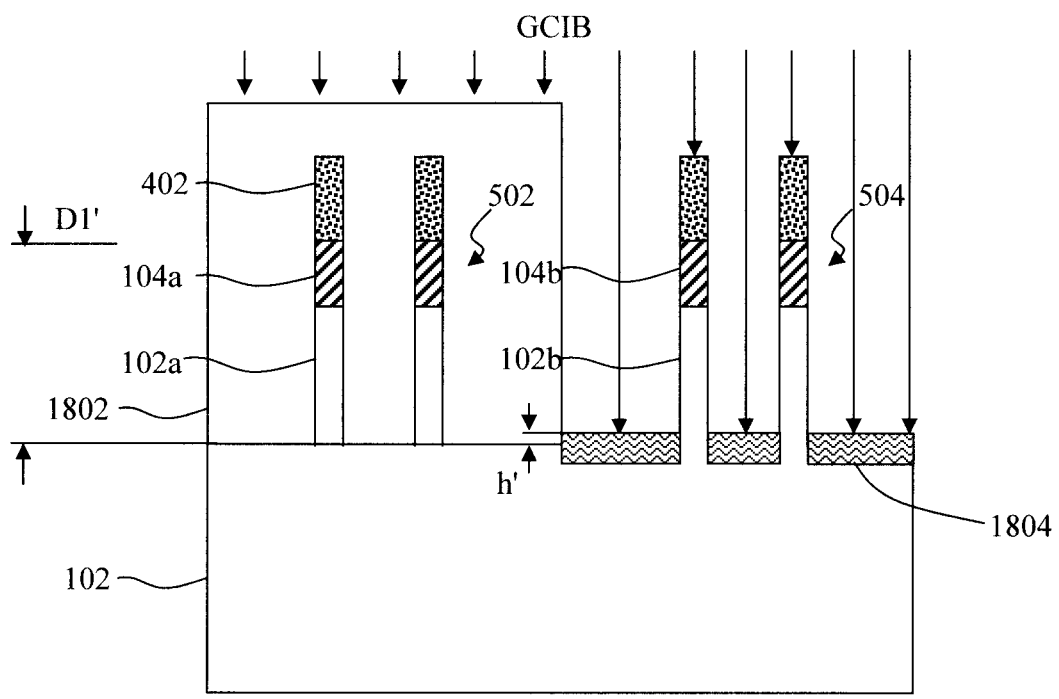
FIG. 18 is a diagram which follows from FIG. 5 illustrating, according to an alternative embodiment, a block mask having been formed over the (first) fins, and a low temperature GCIB oxidation process having been used to form a GCIB oxide on the (second) fins and on the substrate 102 at the base of (first) fins according to an embodiment of the present invention.

Following fin patterning, in this example, a low-temperature oxidation process (e.g., room temperature GCIB oxidation) is then used to selectively recess the fins 504. First, however, a block mask 1802 is formed over the fins 502. See FIG. 18. As shown in FIG. 18, placement of the block mask 1802 selectively exposes the fins 504 to a low temperature oxidation process to recess the base of fins 504.

According to an exemplary embodiment, the oxidation is carried out using a low-temperature (e.g., from about 20° C. to about 30° C., and ranges therebetween) GCIB oxidation process. As provided above, use of a room temperature oxidation process is advantageous because it does not cause undesired dopant diffusion from the patterned portion 104a,b of the doped layer 104 into the vertical fin channels (i.e., patterned portions 102a,b of the substrate 102) of fins 502/504, respectively.

As shown in FIG. 18, a GCIB oxide 1804 is formed on the exposed horizontal surfaces of fins 504 and the substrate 102 at the base of fins 504. Formation of this GCIB oxide 1804 consumes a portion of the fins 504 and the substrate 102 at the base of fins 504. As a result, when the GCIB oxide 1804 is later removed (see below), the fins 504 will be recessed (e.g., from about 2 nanometers (nm) to about 3 nm, and ranges therebetween). Following the GCIB oxidation, the block mask 1802 is removed.

It is notable that there is volume expansion during the GCIB oxidation process. Thus, as shown in FIG. 18, the top of the GCIB oxide 1804 formed is actually at height h' taller than the top surface of the substrate 102. This volume expansion can be as high as 2:1. Thus, for example, a GCIB oxide 1804 formed to a thickness of about 6 nm consumes about 3 nm of the substrate 102, i.e., h'=3 nm.

Removal of the GCIB oxide 1804 (e.g., using an oxide-selective etch) reveals that the fins 504 have been recessed relative to the fins 502. See FIG. 19. As a result, the height of fins 504 is increased relative to fins 502.

Figure 19:
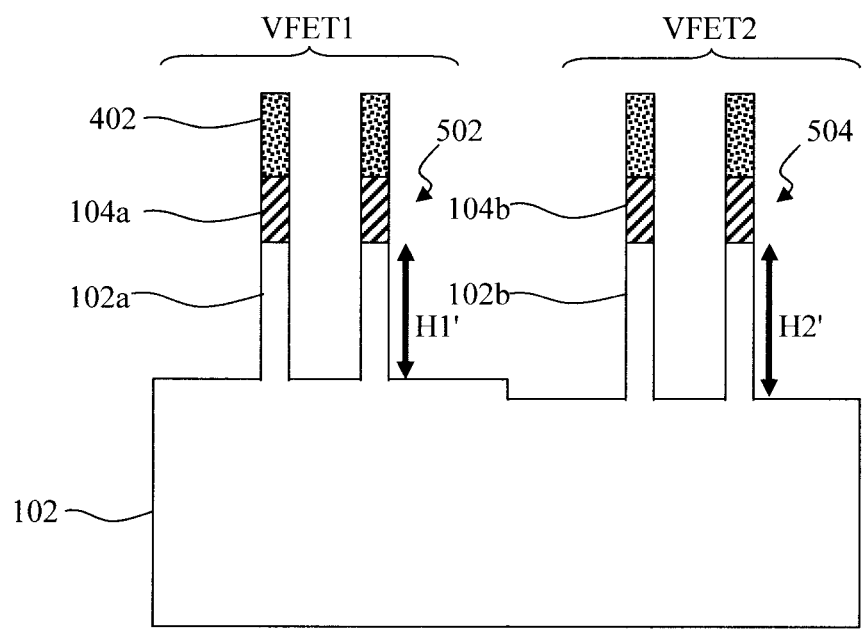
FIG. 19 is a diagram illustrating the GCIB oxide having been removed revealing that the (second) fins have been recessed thereby increasing the height of the (second) fins, the (first) fins corresponding to at least one VFET1 and the (second) fins corresponding to at least one VFET2 according to an embodiment of the present invention.
Figure 20:
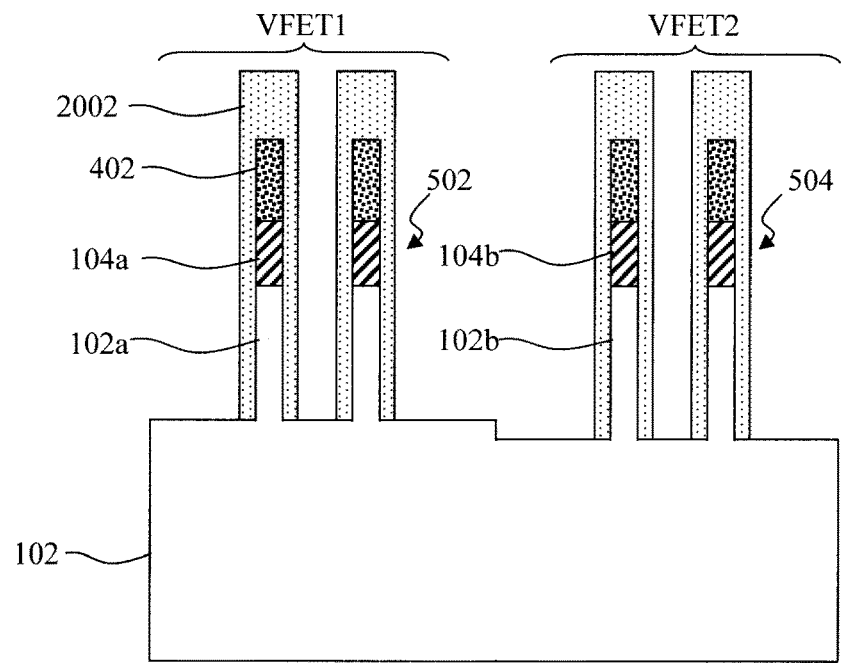
FIG. 20 is a diagram illustrating sacrificial spacers having been formed alongside the fins according to an embodiment of the present invention.

For instance, as shown in FIG. 19, the (as-patterned) fins 502 have a height H1', whereas the (recessed) fins 504 have a height H2', wherein H2'>H1'. As highlighted above, the fins 502 will be used as the basis for forming VFETs having a first gate length (Lg1') and the fins 504 will be used as the basis for forming VFETs having a second gate length (Lg2'), wherein Lg2'>Lg1'. For clarity, these devices are labeled in the figures that follow as VFET1 and VFET2, respectively.

In order to open up the base of the fins 502/504 for bottom source and drain formation (while at the same time protecting the vertical fin channels—i.e., the patterned portions 102a,b of substrate 102), sacrificial spacers 2002 are next formed alongside the fins 502/504. See FIG. 20. As provided above, suitable sacrificial spacer materials include, but are not limited to, $SiO_2$, SiN and/or SiON.

Figure 21:
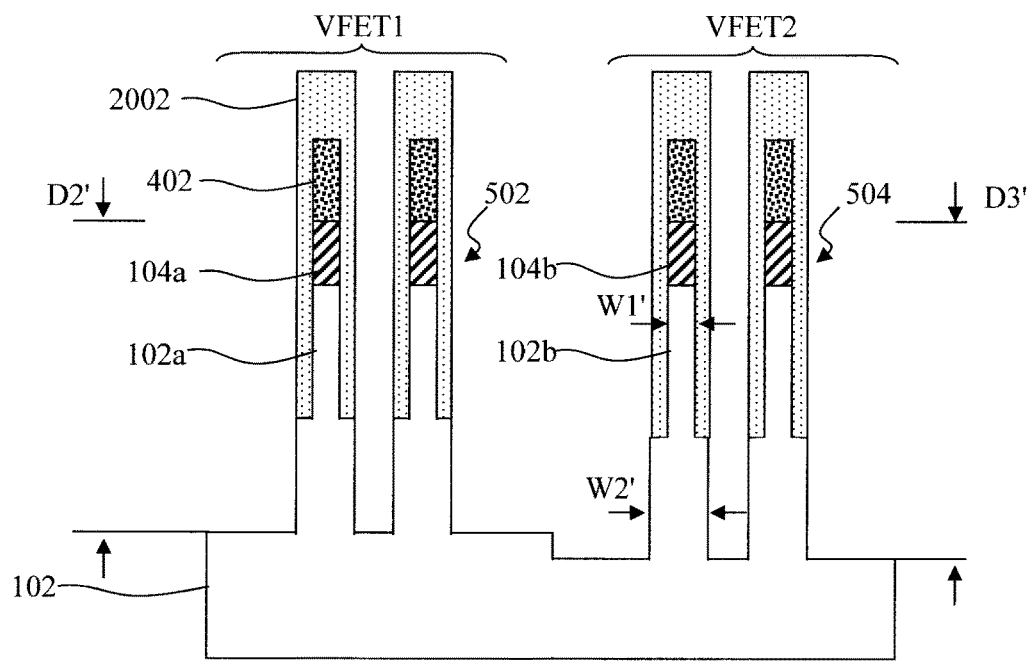
FIG. 21 is a diagram illustrating the fins having been extended into the substrate according to an embodiment of the present invention.

Next, as shown in FIG. 21, the fins 502 and 504 are extended into the substrate 102. However, due to the recess of the substrate 102 at the base of the fins 504, the fins 502 will extend to a depth D2', whereas the fins 504 will extend to a depth D3', wherein D'3>D2'>D1' (compare, e.g., with the partial fin etch shown in FIG. 19). Further, as a result of this two step fin etch and placement of the sacrificial spacers 2002, the tops of the fins 502 and 504 each have a first width W1', and the base/bottoms of the fins 502/504 each have a second width W2', wherein W2'>W1'. See FIG. 21.

Figure 22:
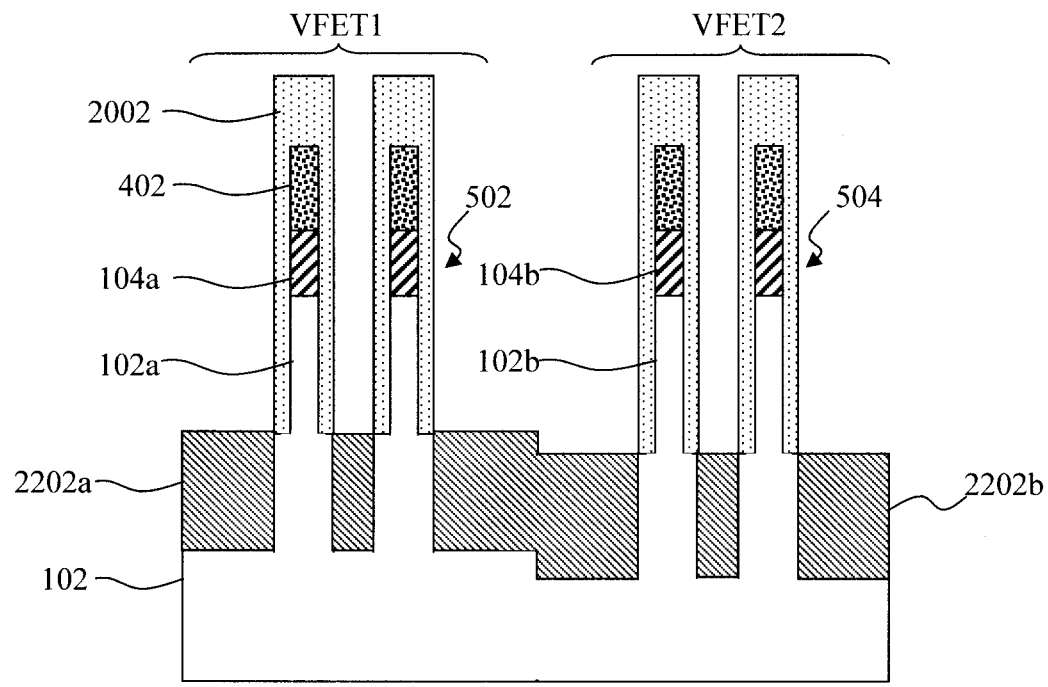
FIG. 22 is a diagram illustrating bottom source and drains having been formed at the base of the fins according to an embodiment of the present invention.

As highlighted above, the extended fin etch exposes the base of the fins 502/504 for bottom source and drain formation. For example, as shown in FIG. 22 bottom source and drains 2202 are next formed at the base of the fins 502/504. According to an exemplary embodiment, the bottom source and drains 2202 are formed from an in-situ doped (i.e., during growth) or ex-situ doped (i.e., via a process such as ion implantation) epitaxial material (e.g., epitaxial Si, Ge and/or SiGe). As provided above, suitable n-type dopants include phosphorous (P) and/or arsenic (As), and suitable p-type dopants include, but are not limited to, boron (B).

However, as provided above, other techniques are also contemplated herein for forming the bottom source and drains 2202. For instance, the bottom source and drains 2202 can instead be formed using ion implantation of a dopant(s) (P, As, and/or B) into the substrate 102 beneath the fins 502 and 504. Following formation of the bottom source and drains 2202, the sacrificial spacers 2002 are removed.

It is notable that in this particular example the bottom source and drains 2202 have the same thickness in the VFET1 and VFET2 devices. Compare this configuration with the first exemplary embodiment where the bottom source and drains in VFET2 device were recessed and thus thinner than the bottom source and drains in the VFET1 device. In this case however, the bottom source and drains 2202 are being formed over a recessed substrate 102 at the base of the fins 504. Thus, the bottom source and drains 2202 in the VFET2 device are lower than the bottom source and drains in the VFET1 device. See FIG. 22. For clarity, the bottom source and drains 2202 at the base of the fins 502 and 504 will now be given reference numerals 2202a and 2202b, respectively.

Figure 23:
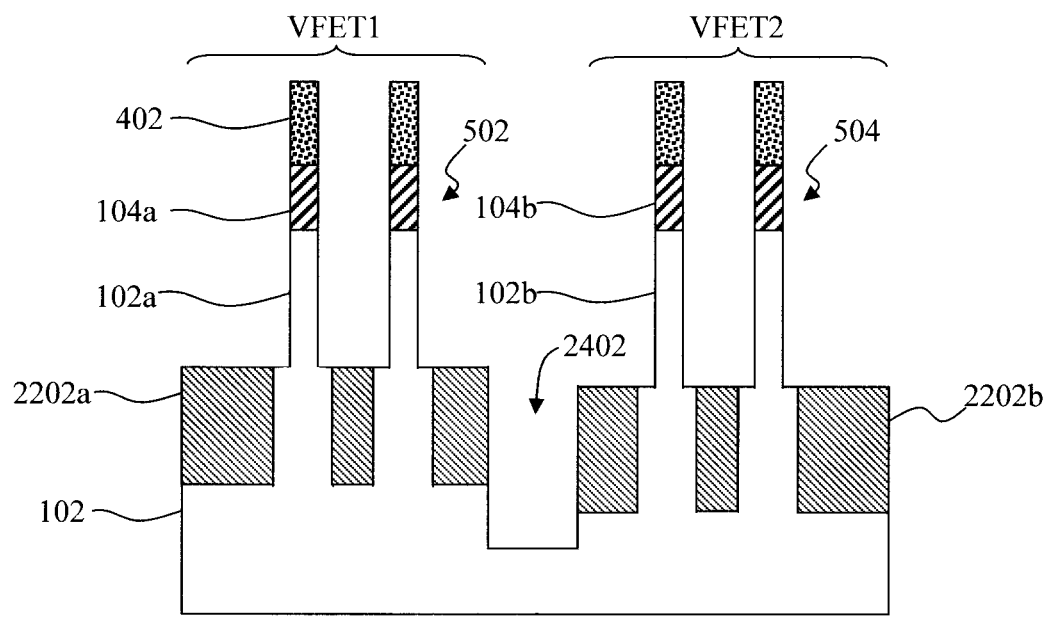
FIG. 23 is a diagram illustrating a trench having been patterned in the substrate separating the (first) fins from the (second) fins according to an embodiment of the present invention.
Figure 24:
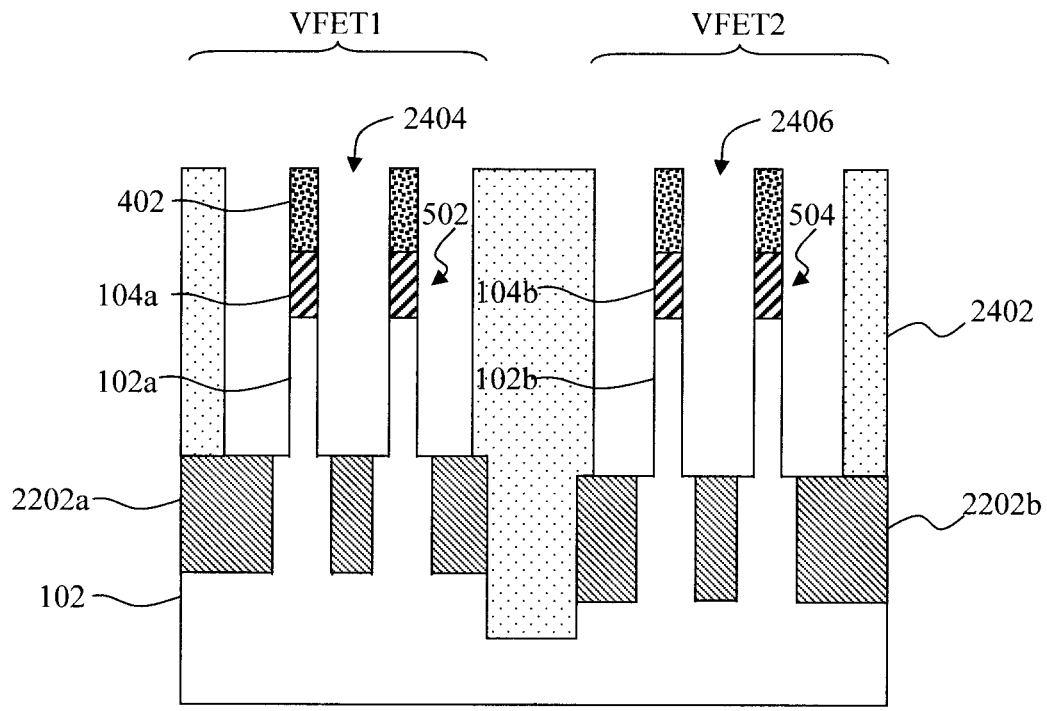
FIG. 24 is a diagram illustrating the fins having been buried in an insulator that fills the trench, and the insulator having been opened up in gate regions of the VFET1 and VFET2 devices according to an embodiment of the present invention.
Figure 25:
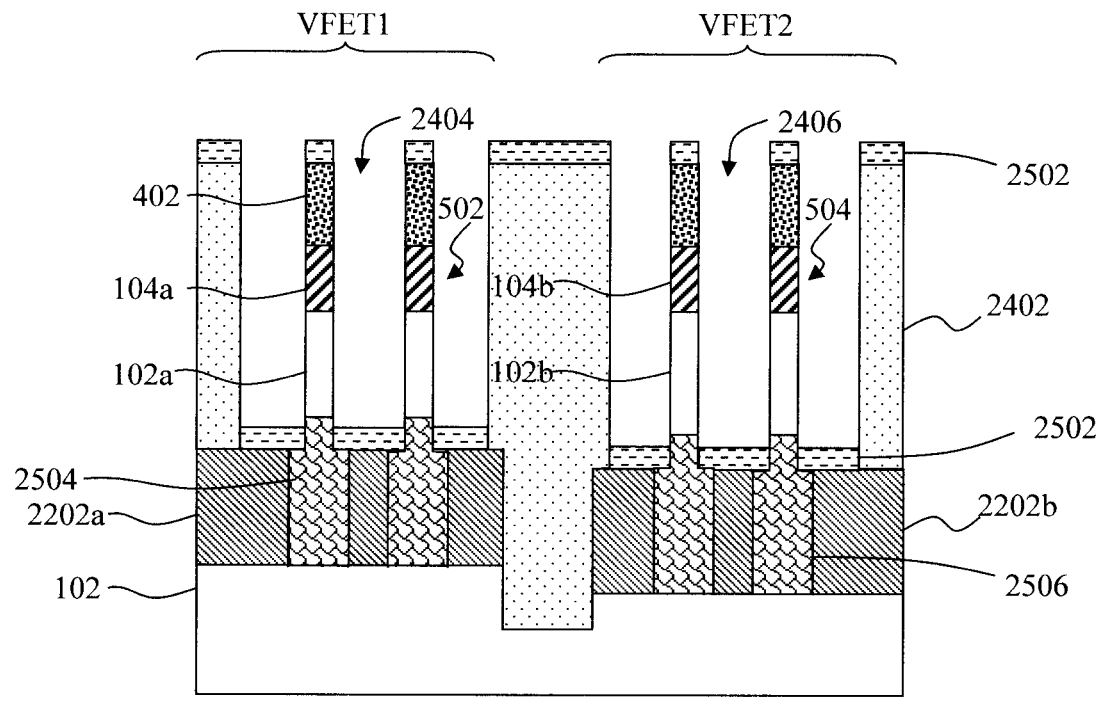
FIG. 25 is a diagram illustrating bottom spacers having been formed on the bottom source and drains at the base of the (first) fins and the (second) fins, and extensions having been formed between the bottom source and drains and the vertical fin channels according to an embodiment of the present invention.

In the same manner as above, isolation between the VFET1 fins 502 and the VFET2 fins 504 is created using a shallow trench isolation process. Namely, as shown in FIG. 23 a trench 2302 is first patterned in the substrate 102 separating the fins 502 from the fins 504. The fins 502 and 504 are then buried in an insulator 2402 (e.g., $SiO_2$) that fills the trench 2302. Standard lithography and etching techniques are next used to open up the insulator 2402 in gate regions of the VFET1 and VFET2 devices. See FIG. 24. As shown in FIG. 24, opening up the gate regions of the VFET1 and VFET2 devices involves removing the insulator 2402 from along the sidewalls of the fins 502 and 504 which forms trenches 2404 and 2406, respectively, in the insulator 2402. As shown in FIG. 24, fins 502 and 504 are present in trenches 2404 and 2406 in the insulator 2402.

Bottom spacers 2502 are then formed on the bottom source and drains 2202a,b at the base of the fins 502 and 504, respectively. See FIG. 25. As above, suitable materials for the bottom spacers 2502 include, but are not limited to, oxide spacer materials $SiO_2$ and/or SiOC and/or nitride spacer materials such as SiN and/or SiBN.

According to an exemplary embodiment, the bottom spacers 2502 are formed using a directional deposition process whereby the spacer material is deposited onto the bottom source and drains 2202a,b, fin hardmasks 402 and insulator 2402 with a greater amount of the material being deposited on these horizontal surfaces as compared to exposed vertical surfaces (such as along sidewalls of the fins 502 and 504). Thus, when an etch is used on the spacer material, the timing of the etch needed to remove the spacer material from the vertical surfaces will leave the bottom spacers 2502 shown in FIG. 25 on the bottom source and drains 2202a,b (as well as on the fin hardmasks 402 and insulator 2402) since a greater amount of the spacer material was deposited on these horizontal surfaces to begin with. By way of example only, a HDP CVD or PVD process can be used for directional film deposition, and an oxide- or nitride-selective (depending on the spacer material) isotropic etch can be used to remove the (thinner) spacer material deposited onto the vertical surfaces.

The thermal anneal during the gate processing (and optionally a thermal anneal prior to the gate processing) serves to drive dopants from the bottom source and drains 2202a,b into the base of the fins 502 and 504, respectively to form extensions 2504 and 2506 between the bottom source and drains 2202a,b and the vertical fin channels (i.e., patterned portions 102a,b of the substrate 102), and from the patterned portion 104a,b of the doped layer 104 into the vertical fin channels (i.e., patterned portions 102a,b of the substrate 102), respectively.

Gates (i.e., a gate dielectric and a gate conductor) are formed alongside the fins 502 and 504 above the bottom source and drains 2202a,b. To form the gates, an interfacial oxide 2602 (e.g., $SiO_2$ which may include other chemical elements in it such as nitrogen, germanium, etc.) is first formed selectively on exposed surfaces of the fins 502 and 504 by an oxidation process to a thickness of from about 0.3 nm to about 5 nm, and ranges therebetween, e.g., about 1 nm. A conformal gate dielectric 2604 is then deposited (into trenches 2404 and 2406) onto the fins 502/504, respectively, over the interfacial oxide 2602 and onto insulator 2402 and the bottom spacers 2502. A gate conductor 2606 is then deposited onto the conformal gate dielectric 2604.

According to an exemplary embodiment, a metal gate is formed wherein the gate conductor 2606 is a metal or combination of metals and the gate dielectric 2604 is a high-κ dielectric. For instance, the gate conductor 2606 is a workfunction setting metal. As provided above, suitable n-type workfunction setting metals include, but are not limited to, TiN, TaN, Al-containing alloys such as TiAl, TiAlN, TiAlC, TaAl, TaAlN, TaAlC and/or W. Suitable high-κ gate dielectrics include, but are not limited to, $HfO_2$ and/or $La_2O_3$.

Figure 26:
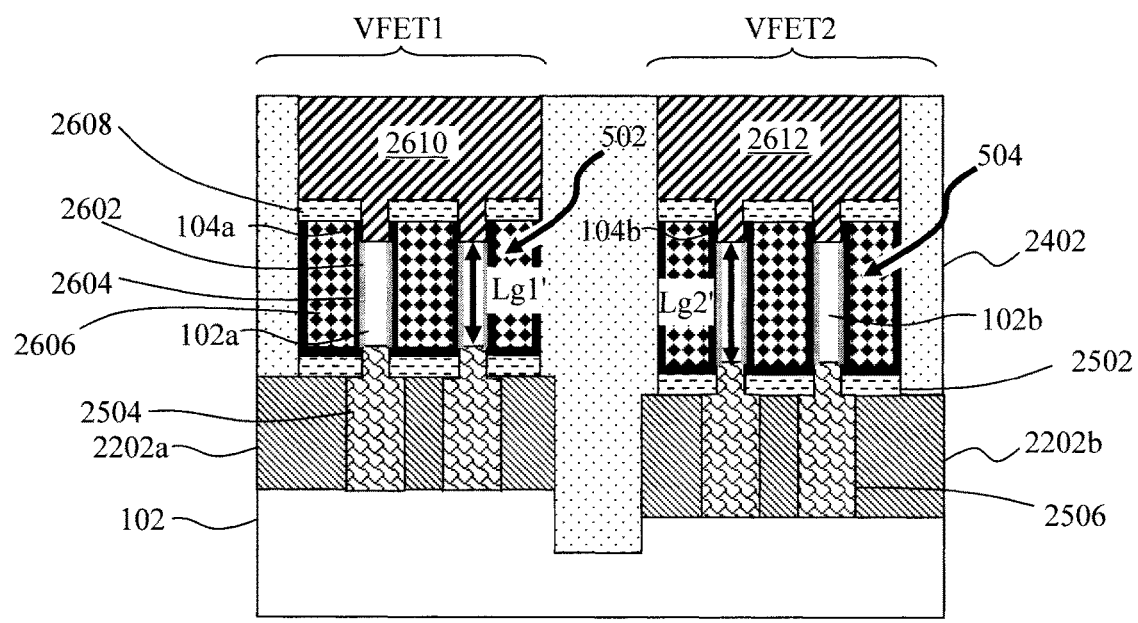
FIG. 26 is a diagram illustrating gates having been formed alongside the fins, the gates having been recessed, top spacers having been formed above the gates at the tops of the fins, and top source and drains having been formed over the top spacers according to an embodiment of the present invention.

The gates (i.e., interfacial oxide 2602, gate dielectric 2604 and gate conductor 2606) are then recessed to expose the tops of the fins 502 and 504 for top source and drain formation. See FIG. 26. Notably, as shown in FIG. 26, the gates are recessed to the same (level) in both the VFET1 and VFET2 regions. However, due to a deeper recess of the fins 504 in the VFET2 region of the wafer 102 (to a height H2') as compared to the height (H1') of the fins 502 in the VFET1 region of the wafer 102, the gate length of the VFET2 (Lg2) will be greater than the gate length of the VFET1 (Lg1), i.e., Lg2>Lg1.

As shown in FIG. 26, top spacers 2608 are then formed above the gates at the tops of the fins 502 and 504. As above, suitable materials for the top spacers 2608 include, but are not limited to, oxide spacer materials such as $SiO_2$ and/or SiOC and/or nitride spacer materials such as SiN and/or SiBN. Like the bottom spacers 2502, the top spacers 2608 can be formed using a directional deposition process whereby the spacer material is deposited with a greater amount of the material being deposited on horizontal surfaces, as compared to vertical surfaces. Thus, when an etch is used on the spacer material, the timing of the etch needed to remove the spacer material from the vertical surfaces will leave the top spacers 2608 shown in FIG. 26 on top of the gates since a greater amount of the spacer material was deposited on these (horizontal) surfaces to begin with.

Top source and drains 2610 and 2612 are then formed over the top spacers 2608 at the tops of the fins 502 and 504, respectively. According to an exemplary embodiment, the top source and drains 2610 and 2612 are formed from an in-situ doped (i.e., during growth) or ex-situ doped (i.e., via a process such as ion implantation) epitaxial material. Suitable epitaxial materials include, but are not limited to, epitaxial Si, Ge and/or SiGe. Suitable n-type dopants include phosphorous (P) and/or arsenic (As), and suitable p-type dopants include, but are not limited to, boron (B). As provided above, patterned portions 104a,b serve as extensions between the top source and drains 2610/2612 and the vertical fin channels (i.e., patterned portions 102a,b of the substrate 102, respectively).

Based on this alternate low-temperature (GCIB-based) oxidation process, as shown in FIG. 26, the VFET1 devices have a gate length Lg1' and the VFET2 devices have a gate length Lg2', wherein Lg2'>Lg1'. As above, the gate length is measured as the length of the vertical fin channels vertical fin channels (i.e., the patterned portions 102a,b of the substrate 102) in between the top source and drain extensions (i.e., patterned portions 104a,b of the doped layer 104) and the bottom source and drain extensions (i.e., extensions 2504 and 2506).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming of forming fins having different heights, the method comprising the steps of:
   patterning the fins having a uniform height in a substrate, the fins comprising at least one first fin and at least one second fin;
   after the fins are patterned, forming an oxide at a base of the at least one second fin using a low-temperature directional oxidation process; and
   removing the oxide from the base of the at least one second fin to reveal the at least one second fin having a height H2, wherein the at least one first fin has a height H1, and wherein H2>H1.

2. The method of claim 1, wherein the low-temperature directional oxidation process comprises a gas cluster ion beam (GCIB) oxidation process.

3. The method of claim 2, wherein the GCIB process is used to form the oxide at a temperature of from about 20° C. to about 30° C., and ranges therebetween.

4. A method of forming a vertical field effect transistor (VFET) device, the method comprising the steps of:
   patterning fins having a uniform height in a substrate, the fins comprising at least one first fin and at least one second fin;
   forming bottom source and drains at a base of the fins;
   selectively recessing the at least one second fin and the bottom source and drains at the base of the at least one second fin using a low-temperature directional oxidation process such that i) the at least one first fin has a height H1 and the at least one second fin has a height H2, wherein H2>H1, and ii) the bottom source and drains at the base of the at least one first fin has a thickness t1 and the bottom source and drains at the base of the at least one second fin has a thickness t2, wherein t1>t2, and wherein H1+t1=H2+t2;
   forming bottom spacers on the bottom source and drains;
   forming gates above the bottom spacers alongside the fins, wherein the gates alongside the at least one first fin have a first gate length Lg1, wherein the gates alongside the at least one second fin have a second gate length Lg2, and wherein Lg2>Lg1;

forming top spacers above the gates at tops of the fins; and forming top source and drains above the top spacers.

5. The method of claim 4, wherein the low-temperature directional oxidation process comprises a GCIB oxidation process performed at a temperature of from about 20° C. to about 30° C., and ranges therebetween.

6. The method of claim 4, wherein the patterning step comprises patterning the fins to a first depth (D1) in the wafer, the method further comprising the steps of:

forming sacrificial spacers alongside the fins;

extending the fins in the substrate to a second depth (D2), wherein D2>D1, which exposes the base of the fins below the sacrificial spacers;

forming the bottom source and drains at the base of the fins; and removing the sacrificial spacers.

7. The method of claim 4, further comprising the steps of:

selectively forming an oxide on the bottom source and drains at the base of the at least one second fin using the low-temperature oxidation process; and removing the oxide from the base of the at least one second fin to reveal that the at least one second fin and the bottom source and drains at the base of the at least one second fin have been recessed.

8. The method of claim 7, wherein the step of selectively forming the oxide comprises the step of:

forming a block mask over the at least one first fin.

9. The method of claim 4, wherein the step of forming the gates alongside the fins comprises the steps of:

forming an interfacial oxide on the fins;

depositing a conformal gate dielectric onto the fins over the interfacial oxide; and depositing a gate conductor onto the conformal gate dielectric.

10. The method of claim 9, wherein the conformal gate dielectric comprises a high-κ dielectric selected from the group consisting of: hafnium oxide ($HfO_2$), lanthanum oxide ($La_2O_3$), and combinations thereof.

11. The method of claim 9, wherein the gate conductor comprises a workfunction setting metal selected from the group consisting of: titanium nitride (TiN), tantalum nitride (TaN), aluminum (Al)-containing alloys, titanium aluminide (TiAl), titanium aluminum nitride (TiAlN), titanium aluminum carbide (TiAlC), tantalum aluminide (TaAl), tantalum aluminum nitride (TaAlN), tantalum aluminum carbide (TaAlC), tungsten (W), and combinations thereof.

12. The method of claim 4, further comprising the steps of:

forming a doped layer on the substrate;

patterning the fins in the doped layer and the substrate, such that each of the fins comprises a patterned portion of the substrate and a patterned portion of the doped layer, wherein the patterned portion of the substrate comprises a vertical fin channel, and wherein the patterned portion of the doped layer comprises an extension between the top source and drains and the vertical fin channel.

* * * * *